United States Patent
Eleyan et al.

(10) Patent No.: US 7,164,612 B1
(45) Date of Patent: Jan. 16, 2007

(54) TEST CIRCUIT FOR MEASURING SENSE AMPLIFIER AND MEMORY MISMATCHES

(75) Inventors: Nadeem N. Eleyan, Austin, TX (US); Howard L. Levy, Cedar Park, TX (US); Jeffrey Y. Su, Cedar Park, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 98 days.

(21) Appl. No.: 10/683,636

(22) Filed: Oct. 10, 2003

(51) Int. Cl.
*G11C 7/00* (2006.01)
(52) U.S. Cl. ................................ 365/201; 365/205
(58) Field of Classification Search ................ 365/201, 365/204, 207, 100, 103
See application file for complete search history.

(56) References Cited

U.S. PATENT DOCUMENTS

| | | | |
|---|---|---|---|
| 3,838,295 A | | 9/1974 | Lindell |
| 4,555,777 A | * | 11/1985 | Poteet .................... 365/205 |
| 5,248,946 A | | 9/1993 | Murakami et al. |
| 5,414,663 A | | 5/1995 | Komarek et al. |
| 5,515,310 A | | 5/1996 | Winters |
| 5,525,919 A | | 6/1996 | Phelan |
| 5,539,700 A | | 7/1996 | Kawahara et al. |
| 5,627,457 A | | 5/1997 | Ishiyama et al. |
| 5,638,333 A | | 6/1997 | Lee |
| 5,650,979 A | | 7/1997 | Komarek et al. |
| 5,696,726 A | | 12/1997 | Tsukikawa |
| 5,710,737 A | | 1/1998 | Komiya et al. |
| 5,731,716 A | | 3/1998 | Pascucci |
| 5,764,178 A | | 6/1998 | Kim |
| 5,764,572 A | * | 6/1998 | Hammick .............. 365/189.01 |
| 5,796,993 A | | 8/1998 | Maguire |
| 5,894,233 A | | 4/1999 | Yoon |
| 5,982,693 A | | 11/1999 | Nguyen |
| 6,005,824 A | | 12/1999 | Crafts |
| 6,038,181 A | | 3/2000 | Braceras et al. |
| 6,038,187 A | * | 3/2000 | El Hajji .................... 365/222 |
| 6,038,195 A | | 3/2000 | Farmwald et al. |
| 6,041,419 A | | 3/2000 | Huang et al. |

(Continued)

FOREIGN PATENT DOCUMENTS

FR      2 792 760      10/2000

OTHER PUBLICATIONS

Eleyan, et al., U.S. Appl. No. 10/074,396, entitled "Mechanism to Minimize Failure in Differential Sense Amplifiers," filed Feb. 11, 2002, pp. 22.

(Continued)

*Primary Examiner*—Thong Q. Le
(74) *Attorney, Agent, or Firm*—Dorsey & Whitney LLP

(57) ABSTRACT

Post-manufacture compensation for a sensing offset can be provided, at least in part, by selectively exposing one of a pair of cross-coupled transistors in a sense amplifier to a bias voltage selected to cause a compensating shift in a characteristic of the exposed transistor. In designs susceptible to post-manufacture data dependent creep in a device characteristic, such exposure may be advantageously provided in situ by causing the sense amplifier to sense values purposefully skewed toward a predominate value selected to cause the compensating shift. In some realizations, an on-chip test block is employed to identify and characterize sensing mismatch. Typically, the techniques described herein may be employed to address sensing offsets that have developed post-manufacture due to a data-dependent effect. However, in some realizations, the techniques described herein may be used to address a sensing offset arising at least in part from other or additional sources.

41 Claims, 5 Drawing Sheets

U.S. PATENT DOCUMENTS

| | | |
|---|---|---|
| 6,072,733 A | 6/2000 | Advani |
| 6,101,141 A | 8/2000 | Schöniger et al. |
| 6,111,796 A | 8/2000 | Chang et al. |
| 6,154,064 A | 11/2000 | Proebsting |
| 6,185,712 B1 | 2/2001 | Kirihata et al. |
| 6,285,611 B1 | 9/2001 | Kang |
| 6,288,950 B1 * | 9/2001 | Koike ............... 365/189.09 |
| 6,329,857 B1 * | 12/2001 | Fletcher ............... 327/215 |
| 6,359,816 B1 | 3/2002 | Nurser |
| 6,392,296 B1 * | 5/2002 | Ahn et al. ............... 257/698 |
| 6,428,684 B1 * | 8/2002 | Warburton ............... 205/775 |
| 6,442,099 B1 | 8/2002 | Kant et al. |
| 6,442,644 B1 | 8/2002 | Gustavson et al. |
| 6,462,998 B1 | 10/2002 | Proebsting |
| 6,470,467 B1 | 10/2002 | Tomishima et al. |
| 6,480,037 B1 | 11/2002 | Song et al. |
| 6,519,175 B1 * | 2/2003 | Sadayuki ............... 365/145 |
| 6,531,931 B1 | 3/2003 | Benyamin et al. |
| 6,642,746 B1 | 11/2003 | Donnelly et al. |
| 6,643,164 B1 | 11/2003 | Laurent |
| 6,650,580 B1 | 11/2003 | Braceras |
| 6,717,877 B1 | 4/2004 | Suzuki et al. |
| 6,756,841 B1 | 6/2004 | Jaussi et al. |
| 6,888,771 B1 * | 5/2005 | Hush et al. ............... 365/208 |
| 6,915,237 B1 * | 7/2005 | Hashemian ............... 702/183 |
| 6,967,506 B1 | 11/2005 | Roger |
| 2003/0198112 A1 | 10/2003 | Eleyan et al. |
| 2004/0008534 A1 * | 1/2004 | Kurth et al. ............... 365/149 |
| 2004/0223393 A1 * | 11/2004 | Hush et al. ............... 365/208 |

OTHER PUBLICATIONS

Eleyan, et al., U.S. Appl. No. 10/683,633, entitled "Measuring and Correcting Sense Amplifier and Memory Mismatches Using NBTI," filed Oct. 10, 2003, pp. 31.

* cited by examiner

TEST CIRCUIT FOR MEASURING SENSE AMPLIFIER AND MEMORY MISMATCHES

CROSS-REFERENCE TO RELATED APPLICATION(S)

This application is related to the following, co-pending, commonly-owned, U.S. patent applications:

application Ser. No. 10/074,396, now U.S. Pat. No. 6,574,160, entitled "Mechanism to Minimize Failure in Differential Sense Amplifiers," filed Feb. 11, 2002, and naming Nadeem N. Eleyan, Howard L. Levy and Jeffrey Y. Su as inventors;

application Ser. No. 10/123,480, now U.S. Pat. No. 6,762,961, entitled "Variable Delay Compensation for Data-Dependent Mismatch in Characteristic of Opposing Devices of Sense Amplifier," filed Apr. 16, 2002, and naming Nadeem N. Eleyan, Howard L. Levy and Jeffrey Y. Su as inventors; and application Ser. No. 10/683,633, entitled "Measuring and Correcting Sense Amplifier and Memory Mismatches Using NBTI," filed on even date herewith, and naming Nadeem N. Eleyan, Howard L. Levy and Jeffrey Y. Su as inventors.

BACKGROUND

1. Field of the Invention

The present invention relates generally to integrated circuits and, more particularly, to sensing offsets in an integrated circuit configuration susceptible to data-dependent creep in device characteristics.

2. Description of the Related Art

Typically, modern semiconductor memories (whether embodied in a memory integrated circuit or incorporated in larger designs, e.g., as cache memory of a processor integrated circuit) employ differential bit lines and some sort of differential amplifier or sensing circuit in their design. Such differential amplifier and sensing circuits are commonly known as sense amplifiers (sense amps) and a wide variety of sense amplifier designs are known in the art, including current sensing and voltage sensing variations.

Generally, when designing memory sense amplifiers, great care is taken to optimize timing and balance. Typically, a signal such as a strobe or equalization signal (EQ) is used to time sense amplifier operation. For example, transitions in an EQ signal are often used to equalize the sense amplifier nodes (SA and SA_L) for a period that allows opposing bit-lines (BL and BL_L) to develop sufficient voltage differential to support sensing. Once the BL & BL_L have developed sufficient differential, EQ is transitioned to cause the sense amplifier to actually sense the developed differential.

Particular care is taken in design and fabrication to achieve balance between device and parasitic parameters on either side of the amplifier. Differential sense-amplifiers are designed to detect very small differences in either voltage or current signals from information read from a memory cell (typically, via a differential pair). Accordingly, a mismatch between the sides of the sense amplifier (or the circuit to which it is coupled), can result in a sense amplifier output that incorrectly flips (i.e., is sensed) in a direction opposite to that of the stored value. In other words, the sense amplifier may sense a value of '1' instead of the actual '0,' that is stored in an addressed cell, or vice-versa. One way to address this problem is to introduce more delay into the signal which evaluates the sense-amplifier, thus causing a reduction in performance.

Generally, if the period defined by an EQ transition is too short, then the bit-lines may not develop sufficient differential for the sense amplifier to correctly sense the data being read from an addressed memory cell. On the other hand, if too much time is allowed for EQ, then access time of the memory circuit is increased and achievable operating frequency (or at least memory access bandwidth) may be reduced. Therefore, in high-speed designs, the EQ signal delay path is designed to deliver the EQ transition at just the right time to ensure that correct data is being read, while aiming to minimize shortest cycle time.

The "right time" is typically a function of variations, potentially wafer-to-wafer variations or chip-to-chip variations, in the fixed electrical characteristics of fabricated circuits. To compensate for such variations, metal options may be added to a design to allow an EQ signal delay path to be tuned to the particular requirements of an integrated circuit. For example, a focused ion bean (FIB) fix may be employed to cut the EQ metal and insert additional buffering into the EQ signal path. Unfortunately, such a fix is both costly and only ensures that the EQ signal is appropriate at the time of the FIB fix. Furthermore, as noted above, additional delay can result in reduced performance.

Unfortunately, in certain very-small device technologies, data-dependent effects have begun to present themselves and circuits developed to accommodate variations in supply voltage or to tune timing paths to temperature or supply voltage variables do not adequately address these data-dependent effects. One such effect is Negative Bias Temperature Instability (NBTI). Accordingly, new techniques are desired to address NBTI and other similar or related effects. In addition, techniques are desired whereby NBTI and other similar or related effects may be advantageously exploited to address various sources of mismatch (including, but not limited to, NBTI and other similar or related effects).

SUMMARY

It has been discovered that post-manufacture compensation for a sensing offset can be provided, at least in part, by selectively exposing one of a pair of cross-coupled transistors in a sense amplifier to a bias voltage selected to cause a compensating shift in a characteristic of the exposed transistor. In designs susceptible to post-manufacture data dependent creep in a device characteristic, such exposure may be advantageously provided in situ by causing the sense amplifier to sense values purposefully skewed toward a predominate value selected to cause the compensating shift. In some realizations, purposefully skewed values (e.g., value and value_1) are introduced directly into the sense amplifier. In some realizations, an on-chip test block is employed to identify and characterize sensing mismatch. Typically, the techniques described herein may be employed to address sensing offsets that have developed post-manufacture due to a data-dependent effect. However, in some realizations, the purposeful use of data dependent creep in a device characteristic (e.g., of an NBTI-related threshold voltage shift in a PMOS device) may be used to address a sensing offset arising at least in part from other or additional sources.

In some embodiments in accordance with the present invention, a test block for a memory circuit is configured to characterize in situ a sensing offset of a sensing circuit including a cross-coupled pair of transistors. The test block may selectively introduce discharge paths into respective halves of a differential circuit sensed by the sensing circuit. The discharge paths may be selectively introduced to characterize a direction of the sensing offset. The discharge paths may be selectively introduced to characterize a magnitude of the sensing offset. The sensing offset may result, at least in part, from an accumulated data-dependent mismatch in characteristics of the cross-coupled transistors. The sensing offset may result, at least in part, from a disparate, negative bias temperature instability induced shift in threshold voltage ($V_t$) of at least one of the cross-coupled transistors based on disparate voltage bias histories thereof. The sensing offset may result, at least in part, from process variations in either the transistors or differential pair circuits to which the transistors are coupled.

In some embodiments of the present invention, an integrated circuit includes a first and a second plurality of control signals, a first and a second plurality of ports, and at least a first and a second discharge path coupled to at least one of the respective first and second plurality of ports, the effective strengths of the first and second discharge paths determined by respective ones of the first and second plurality of control signals. The first and the second discharge paths may be selectively loaded to vary the strengths of the first and the second discharge paths. The first and the second discharge paths may be selectively enabled, the first and the second discharge paths selected from respective ones of a first and a second plurality of discharge paths of varying strengths. The first and the second plurality of control signals selectively couple at least respective ones of a first and a second capacitive load to the respective ones of the first and the second plurality of ports. The first and the second plurality of control signals selectively couple at least a first and a second resistive load to the respective ones of the first and the second plurality of ports. The first and the second plurality of control signals may selectively enable at least one of a first plurality of transistors and at least one of a second plurality of transistors coupled to respective ones of the first and the second plurality of ports. The first and the second plurality of control signals may selectively enable at least one of a first plurality of inverters and at least one of a second plurality of inverters coupled to respective ones of the first and the second plurality of ports. In some realizations, the integrated circuit includes a first and a second opposing bitline selectively coupled to the first and the second discharge paths. In some realizations, the integrated circuit includes a control block for generating the first and second plurality of control signals based at least in part on detection of a sensing offset of a sensing circuit including a cross-coupled pair of transistors. The control block may generate additional control signals, the additional control signals at least partially compensating for the detected sensing offset by selectively exposing one of the transistors to a bias voltage selected to cause a compensating shift in a characteristic of the exposed transistor. The sensing offset may result, at least in part, from an accumulated data-dependent mismatch in characteristics of the cross-coupled transistors. The sensing offset may result, at least in part, from a disparate, negative bias temperature instability induced shift in threshold voltage ($V_t$) of at least one of the cross-coupled transistors based on disparate voltage bias histories thereof. The sensing offset may result, at least in part, from process variations in either the transistors or differential pair circuits to which the transistors are coupled. The transistors may be PMOS devices, the characteristic may be threshold voltage ($V_t$), and the sensing offset may involve a monotonic increase in $V_t$ based on disparate voltage bias histories of the PMOS devices. In some realizations, the integrated circuit includes the sensing circuit including the cross-coupled pair of transistors. In some realizations, the integrated circuit includes the differential circuit. The integrated circuit may be embodied in computer readable descriptive form suitable for use in design, test, or fabrication of an integrated circuit. The integrated circuit may be embodied in a cache of a processor integrated circuit.

In some embodiments of the present invention, a method of detecting in situ a sensing offset in a sensing circuit including a pair of cross-coupled transistors includes selectively configuring a pair of discharge paths in a first configuration. The method includes introducing the pair of discharge paths into respective halves of a differential circuit. The method also includes sensing the differential circuit. In some realizations, the method includes characterizing a direction of the sensing offset based at least in part on a value sensed in presence of the discharge paths in the first configuration. The sensing offset may result, at least in part, from an accumulated data-dependent mismatch in characteristics of the cross-coupled transistors. The sensing offset may result, at least in part, from a disparate, negative bias temperature instability induced shift in threshold voltage ($V_t$) of at least one of the cross-coupled transistors based on disparate voltage bias histories thereof. The sensing offset may result, at least in part, from process variations in either the transistors or differential pair circuits to which the transistors are coupled. The transistors may be PMOS devices, the characteristic may be threshold voltage ($V_t$), and the sensing offset may involve a monotonic increase in $V_t$ based on disparate voltage bias histories of the PMOS devices. The first configuration may substantially balance the discharge paths. In some realizations, the method includes selectively configuring the pair of discharge paths in a second configuration. In some realizations, the method includes characterizing a magnitude of the sensing offset based at least in part on a value sensed in presence of the discharge paths in the second configuration. The second configuration may imbalance the discharge paths. In some realizations, the method includes successively changing the imbalance of the discharge paths by selectively reconfiguring the pair of discharge paths. In some realizations, the method includes characterizing a magnitude of the sensing offset based at least in part on a value sensed in presence of the successively changed imbalance of the discharge paths. The third configuration may introduce to the discharge paths an imbalance incrementally varied from prior configurations. The characterization may occur during burn-in. The characterization may occur subsequent to burn-in. The characterization may occur periodically. The characterization may occur in response to sensing memory errors.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
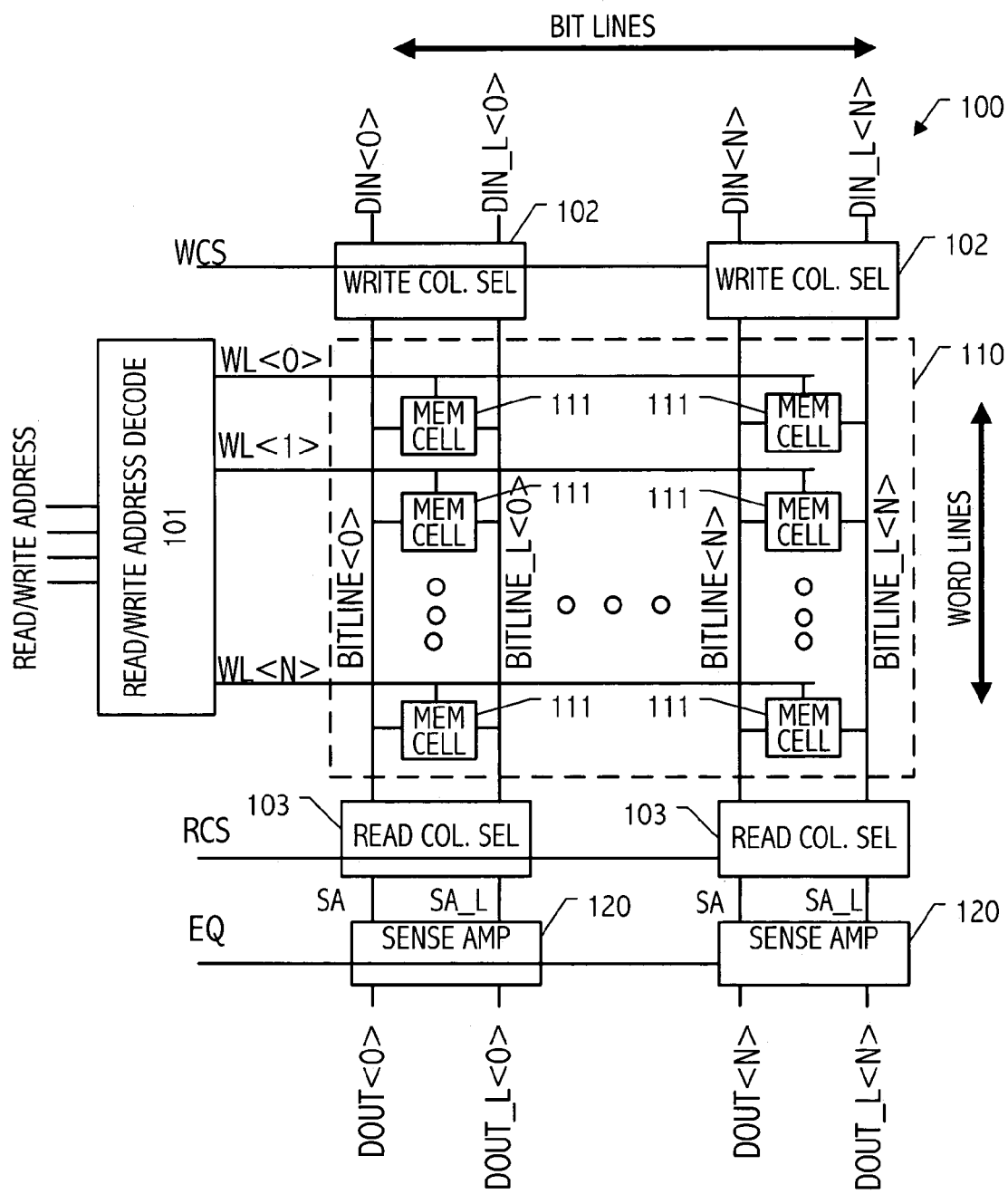
FIG. 1 depicts an illustrative memory array.

The description herein focuses on an illustrative set of sense amplifier circuits and devices, namely PMOS devices thereof, for which a particular source of disparate post-manufacture creep in characteristics is discussed. In particular, the description focuses on negative bias temperature instability-based (NBTI-related) $V_t$ shift based on disparate bias histories of opposing PMOS devices of a sense amplifier of a memory circuit. Negative bias temperature instability-based $V_t$ shift may increase the threshold voltage ($V_t$) of a PMOS device as a function of the historical amount of voltage bias that has been applied across the gate and source/drain nodes. In some circuit designs, sensing predominantly one value may tend to disparately affect one device (or set of devices) as compared with an opposing device (or set of devices). In other words, if the same data value is read repeatedly, then one of two opposing PMOS devices of a typical sense amplifier will accumulate an NBTI-related $V_t$ shift, while the opposing PMOS device will accumulate little or no shift. The accumulated mismatch tends to cause an increase in the sense amplifier fail-point. It is important to note that NBTI-related effects can be both a source of sensing offset (e.g., in a sense amplifier of a semiconductor memory) that the described techniques seek to address and a mechanism for purposefully introducing into a sensing circuit that exhibits a sensing offset, a compensating shift in a device characteristic.

While the particular data-dependent effects illustrated represent an important source of disparate effects (and resulting offsets) for which techniques of the present invention are well adapted to address (and employ), the invention is not necessarily limited thereto. Indeed, based on the description herein, persons of ordinary skill in the art will appreciate applications to other sources of device mismatch in differential circuits. As with NBTI-based effects, other sources of mismatch may be a source of disparate effects and/or a mechanism for introducing compensation. Other effects may include channel hot carrier or tunneling-related effects that disparately affect susceptible configurations of devices. Furthermore, although the techniques described herein are particularly attractive to compensate for disparate post-manufacture creep in device characteristics, in some exploitations, the invented techniques may be employed, in whole, or in part, to address mismatch introduced through process and/or manufacturing variations.

While the NBTI-related $V_t$ shift is generally monotonic, other effects need not be so and may decay over time. Similarly, disparities in device characteristics may grow or diminish based on the particular bias or data histories experienced by a susceptible configuration of opposing devices. Given a particular disparate effect on opposing devices, test and variable delay compensation techniques described herein may be employed or adapted to improve memory system performance. Based on the description herein, persons of skill in the art will appreciate suitable variations on the described techniques for other susceptible circuit configurations and effects. Accordingly, in view of the foregoing, and without limitation, illustrative sense amplifier circuits susceptible to NBTI-related $V_t$ shift in opposing PMOS devices thereof and suitable test and compensation techniques are now described.

FIG. 1 depicts an illustrative memory circuit 100, which is largely conventional in design. Address decode logic 101 and column select logic (e.g., write column select logic 102 and read column select logic 103) provide row (or word line) and column select addressing into an array 110 of memory cells 111. The illustration of FIG. 1 depicts multiple sense amplifiers 120 each corresponding to a column of the array. Timing of each of the depicted sense amplifiers is controlled, at least in part, according to a timing or strobe signal (e.g., timing signal EQ). In general, sense amplifiers may be of any conventional design, including voltage sensing and current sensing designs, and based on the description herein, persons of skill in the art will appreciate a wide variety of suitable designs. Of course, other suitable array configurations may multiplex a given sense amplifier across multiple columns and/or incorporate support for other addressing models, redundant rows or columns, etc.

Signal labels are arbitrary and will be understood as illustrative. For example, while timing signal EQ may suggest equilibration for some realizations, it should not be taken as limiting. Indeed, as used herein, timing signal EQ is representative of any of a variety of sense amplifier timing signals that may be employed in a particular design and for which techniques of the present invention may be employed to accommodate post-manufacture shift in device characteristics through selective introduction of delay.

During typical SRAM operation, data is stored in a memory cell as a pair of true data and its complement, e.g., '1' and '0'. Before the read operation, both the BITLINE and BITLINE_L are precharged to VDD. When the memory cell is read, the true data, e.g., '1', is connected to BITLINE and the complement data, e.g., '0,' is connected to BITLINE_L. As a result, the voltage on BITLINE_L begins to fall while the voltage on BITLINE remains at VDD. When read column select 103 is enabled, BITLINE and BITLINE_L are connected to SA and SA_L respectively. The voltage difference transfers from BITLINE and BITLINE_L to SA and SA_L, respectively. When sense amplifier 120 is enabled, it senses and amplifies the small voltage/current difference between the SA and SA_L nodes.

Figure 2:
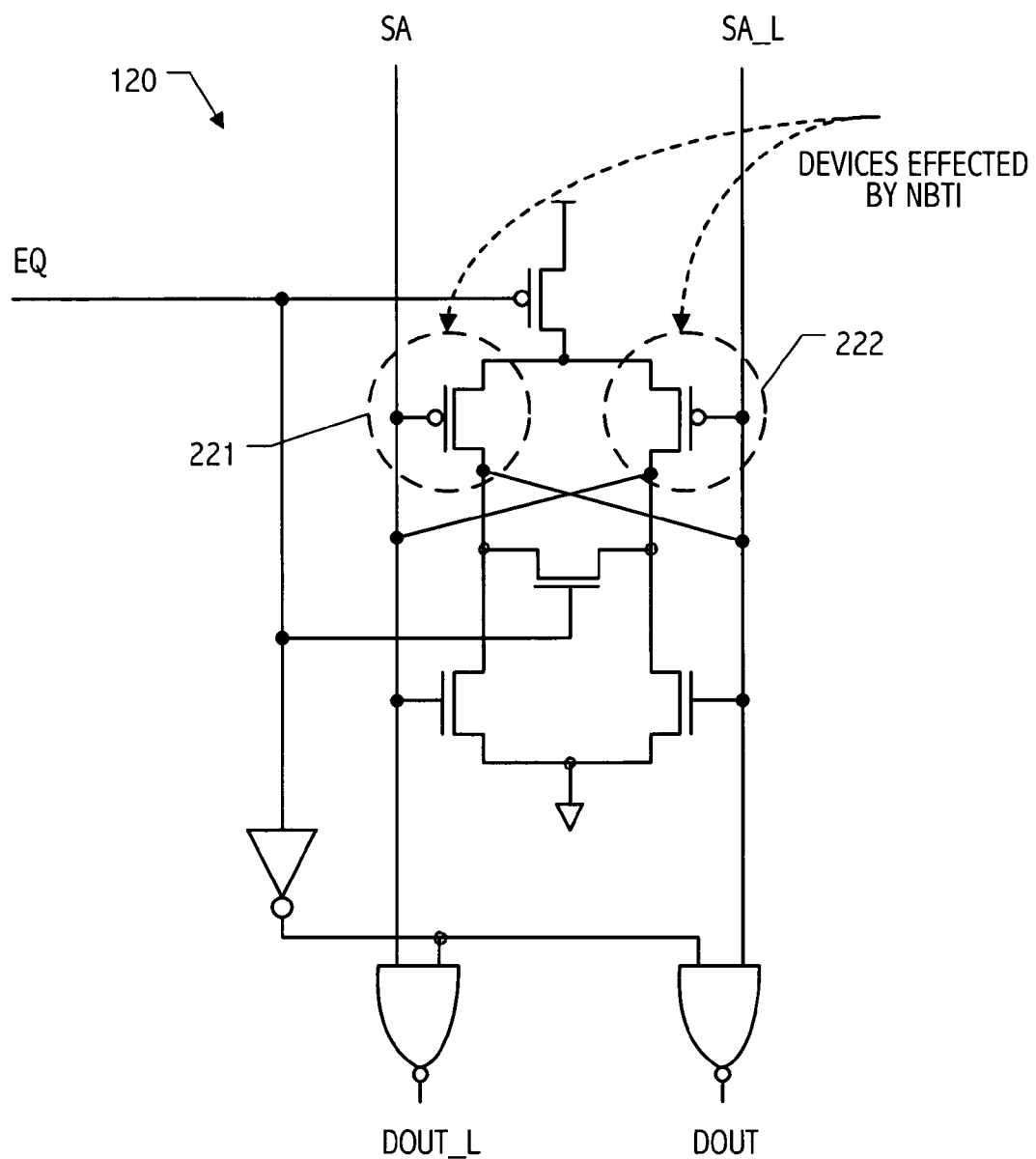
FIG. 2 depicts an illustrative sense amplifier design in which opposing PMOS devices are susceptible to disparate data-dependent bias voltage histories and for which a sensing offset may be compensated by employing techniques in accordance with the present invention to purposefully shift a characteristic of a susceptible device.

Referring now to FIG. 2, an illustrative sense amplifier 120 includes opposing PMOS devices 221 and 222. Under expected design conditions, DOUT and DOUT_L of sense amplifier 120 have logic values corresponding to the data stored in the memory cell. However, mismatches between the sides of the sense amplifier 120 or the memory structure 110, could result in sense amplifier 120 reading incorrect data. As described above, traditional mismatches (e.g., layout mismatches, process variations) typically do not vary during circuit operation. However, NBTI is an effect that changes depending on the history of the data read through sense amplifier 120. If sense amplifier 120 reads from memory a large block of similar data (for example a long sequence of '1's), then, during these reads, one half of sense amplifier 120 is 'on' during the read of this block of data while the other half is 'off' during the read of this block of data. The device driving the SA node, transistor 222, is 'on' during this time while the matched device, transistor 221, driving the SA_L complement node is 'off' during this time. As a result, the NBTI effect is pronounced in transistor 222, i.e., the threshold voltage (V$_t$) for transistor 222 increases while the V$_t$ for transistor 221 remains constant. To avoid sense amplifier failures due to NBTI, a sense amplifier, would generally need to tolerate a worst case NBTI shift.

Figure 3:
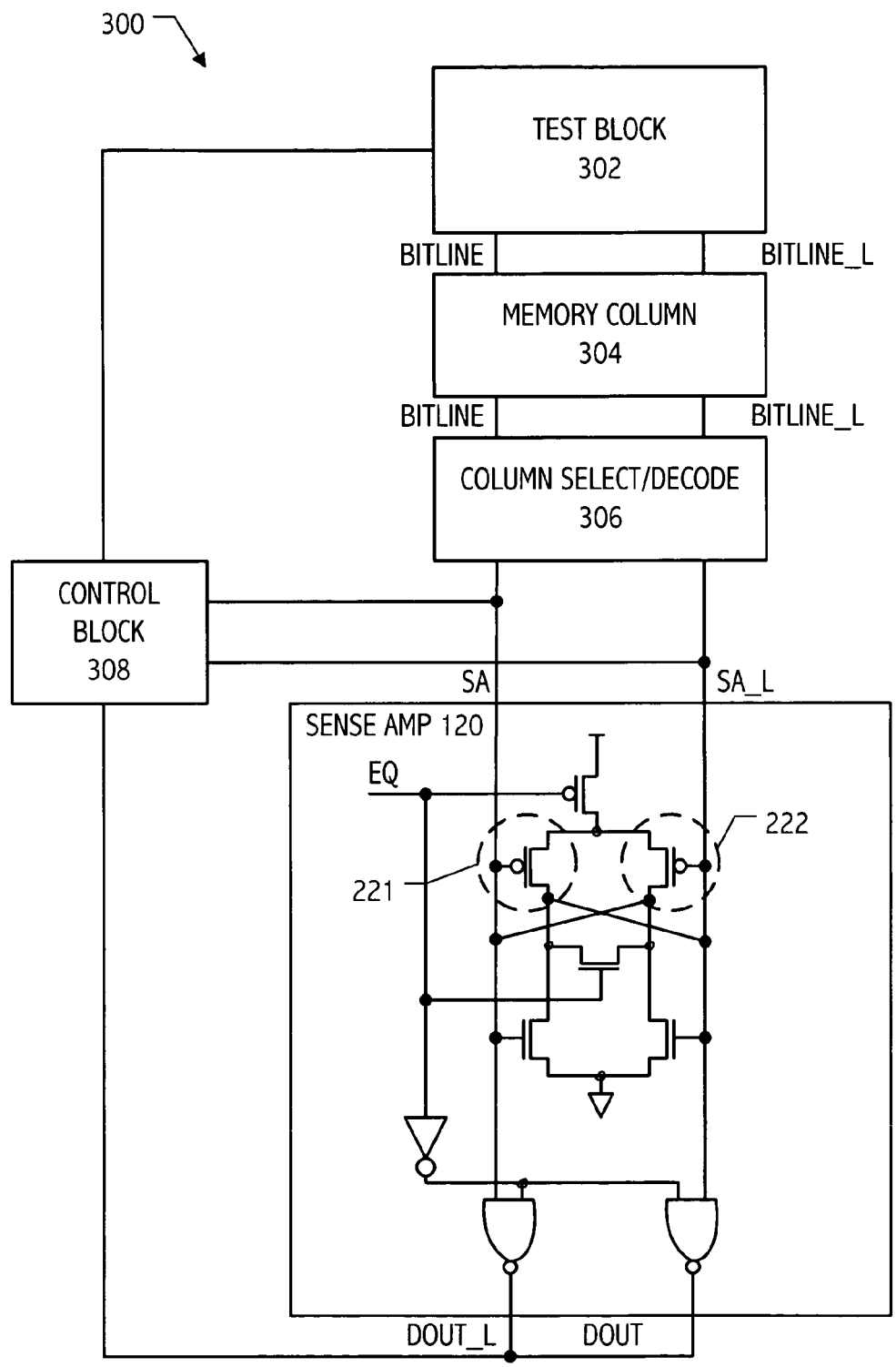
FIG. 3 depicts a configuration, in accordance with some embodiments of the present invention, in which a calibrated test circuit is employed to characterize a sensing offset. The sensing offset may be at least partially compensated by exploiting disparate data dependent effects on cross-coupled devices of a sense amplifier.

Mechanisms have been developed to address NBTI and other similar or related effects. In addition, techniques are desired whereby NBTI and other similar or related effects may be advantageously exploited to address various sources of mismatch (including, but not limited to, NBTI and other similar or related effects). FIG. 3 illustrates an exemplary memory circuit 300. Memory column 304, column select/decode 306, and sense amplifier 120 may be, but are not limited to, typical components of SRAM circuits. Memory column 304 includes memory cells coupled to common complementary traces BITLINE and BITLINE_L. Column select/decode 306 is typically a multiplexing circuit that couples the complementary traces BITLINE and BITLINE_L of memory column 304 to the SA and SA_L nets of sense amplifier 120. Sense amplifier 120 senses the data stored in a memory cell selected from memory column 304. Test block 302 tests for mismatches between the two sides of the sense amplifier 120, memory column 304, and column select/decode 306. Control block 308 generates control signals for test block 302, reads the output of sense amplifier 302, and writes to the SA and SA_L nodes of sense amplifier 120. Test block 302 includes multiple output ports that are all connected back to a single pair of opposing bitline signals (e.g., BITLINE and BITLINE_L). Test block 302 drives 'low' (i.e., discharges) both BITLINE and BITLINE_L. Under ideal conditions, electrical characteristics of each device and conductive path of sense amplifier 120 and memory column 304 match exactly to a corresponding device and conductive path of a respective half of sense amplifier 120 and memory column 304 and the sense amplifier output will float. However, in practice, a mismatch generally exists, causing DOUT and DOUT_L of sense amplifier 120 to output a '1' or a '0' value, depending upon which of the respective halves of sense amplifier 120 and/or memory column 304 the mismatch strengthens.

Figure 4:
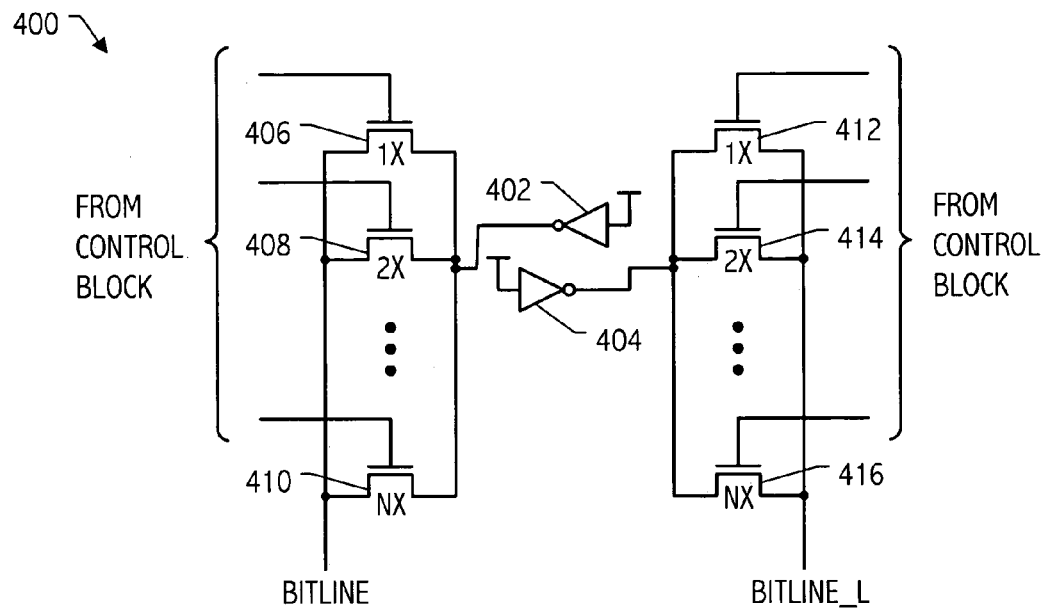
FIGS. 4–7 depict various illustrative configurations for a test circuit that may be employed in some embodiments in accordance with the present invention to identify and characterize a sensing offset in situ.

In one realization, the halves of test block 302 include devices with incrementally increasing strengths, represented by sizes 1×, 2×, . . . , N×. The widths and lengths of the devices in test block 302 are preferably sized larger than the devices in memory column 304 to minimize the mismatches introduced by test block 302. FIGS. 4–7 illustrate exemplary embodiments of test circuit 302 including two distinct discharge paths of selectable strengths. Referring to FIG. 4, inverters 402 and 404 receive VDD inputs, providing a path to ground by enabling an n-transistor within the inverters. The strength of the discharge paths provided by inverters 402 and 404 may be varied and introduced to the opposing bit-line signals by selectively enabling transistors 406-10 and 412-16, respectively. Transistors 406-10 and 412-16 include devices of strengths varied by the W/L of the individual devices.

Figure 5:
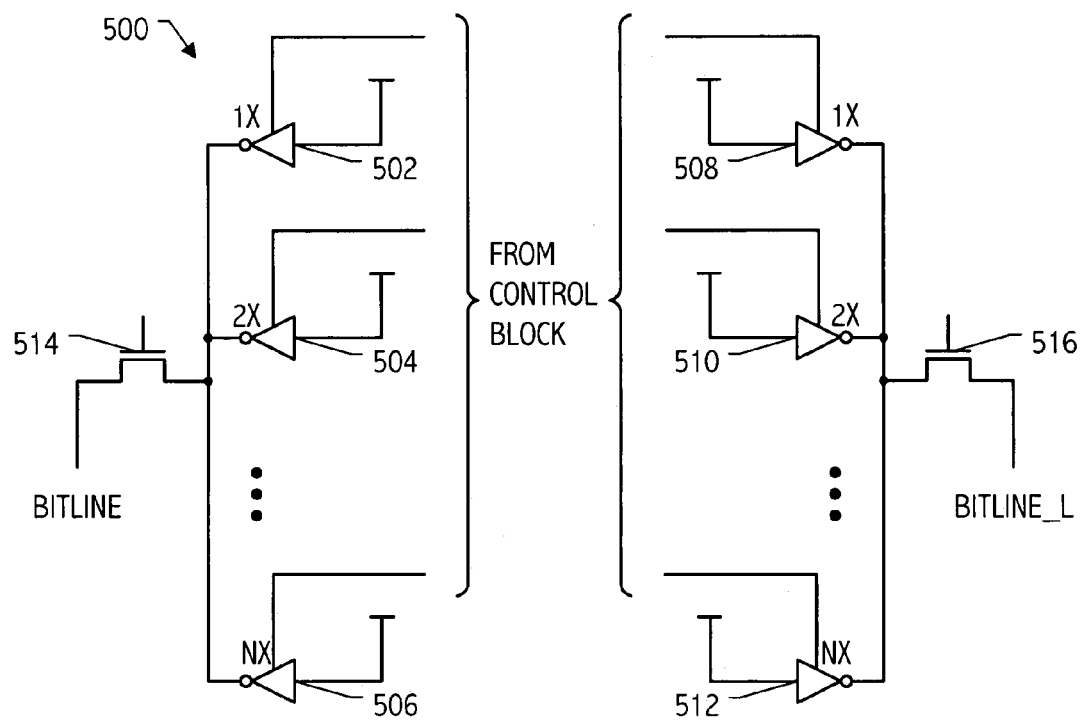

Circuit 500 of FIG. 5 provides discharge paths with strengths adjusted by selectively enabling a path to ground in tri-state inverters 502-06 and 508-12 respectively. Since tri-state inverters 502-06 and 508-12 receive VDD inputs, an n-channel device in each tri-state inverter is enabled, providing a path to ground. The devices included in tri-state inverters 502-06 and 508-12 are sized to incrementally increase the strength of the discharge paths created therefrom. The discharge paths created by tri-state inverters 502-06 and 508-12 are selectively introduced to the opposing bitline signals via signals from control block 308. In addition, control block 308 selectively introduces the discharge paths to BITLINE and BITLINE_by enabling transistors 514 and 516, respectively.

Figure 6:
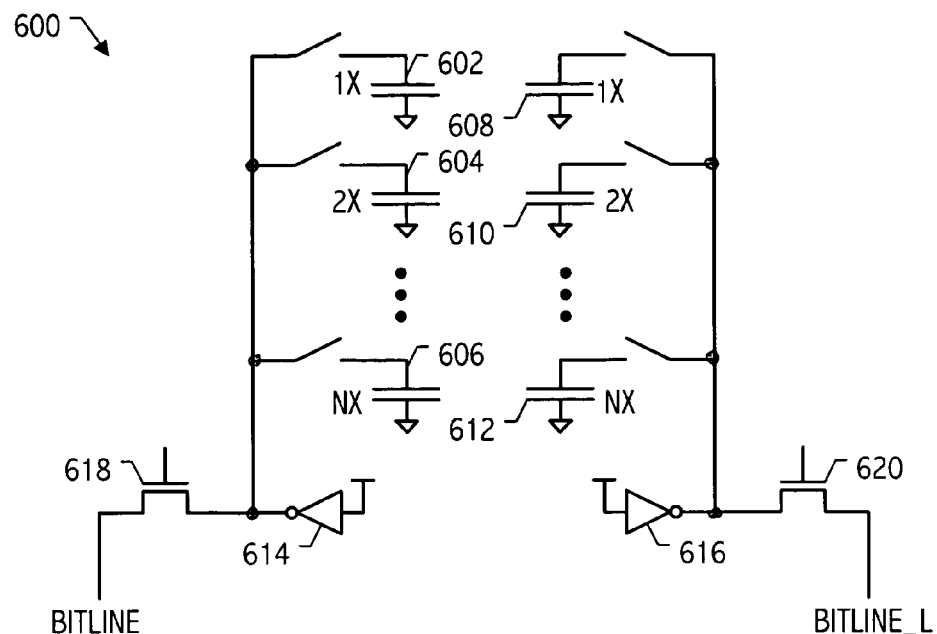
Figure 7:
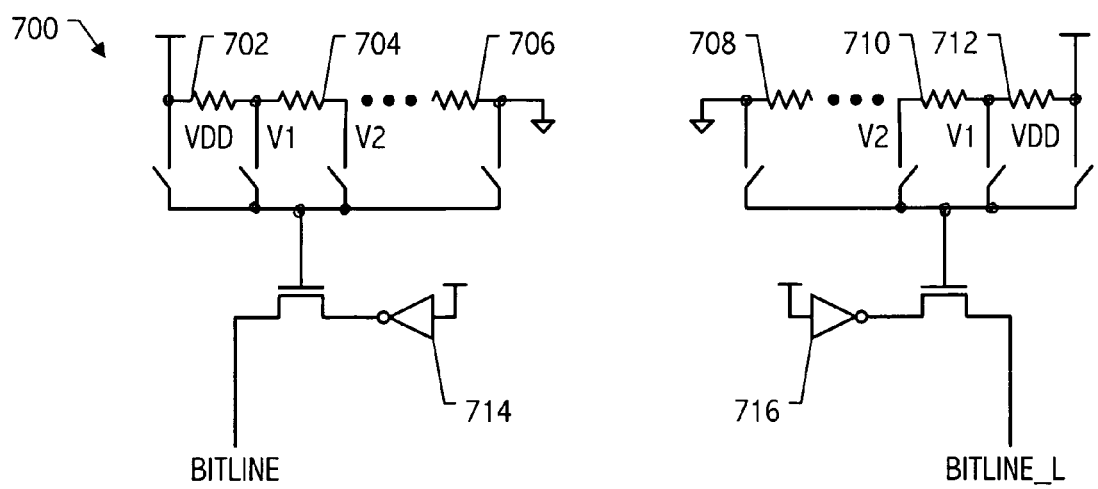

In FIGS. 6 and 7, discharge paths are selectively loaded to vary their strengths. With reference to FIG. 6, circuit 600 inverters 614 and 616 are configured to provide a discharge path, weakened by selectively coupling capacitors 602-06 and 608-12, respectively. Transistors 618 and 620, when enabled, couple the discharge paths to BITLINE and BITLINE_L, respectively. Circuit 700 of FIG. 7 weakens the discharge paths provided by inverters 714 and 716, by selectively coupling resistors 702-06 and 708-12, respectively.

Circuits 400, 500, 600, and 700 illustrate different techniques for implementing and varying the strength of discharge paths. In general, these techniques are not exclusive and persons of skill in the art will appreciate a wide variety of suitable designs. Other suitable circuit configurations may combine individual elements of circuits 400, 500, 600, and 700 to vary strength granularities of the discharge paths and/or to meet particular design constraints.

By selectively coupling different combinations of device strengths to BITLINE and BITLINE_, test block 302 simulates a mismatch. In the following example, under ideal conditions, both BITLINE and BITLINE_L are precharged to VDD and coupled to circuit 400. BITLINE is coupled to a device of size 1× and BITLINE_L is coupled to a device of size 2×. At the start time of the test, the 1× device pulls BITLINE low and the 2× device pulls BITLINE_L low. After an evaluation period, the voltage level at BITLINE_L is lower than the voltage level at BITLINE because the 2× device is stronger than the 1× device. Sense amplifier 120 evaluates at the end of the evaluation period and detects the voltage difference on BITLINE and BITLINE_L, producing an expected output, DOUT, of '1.'

In the above example, the expected output will be the actual output when the devices and wires included in sense amplifier 120 and memory column 304 are exactly matched, or even if a mismatch exists but the mismatch effect is less than the effect of the simulated mismatch corresponding to 1× and 2× devices on BITLINE and BITLINE_L, respectively. However, if the actual mismatch in sense amplifier 120 and/or memory column 304 is greater than the simulated mismatch introduced by using 1× and 2× devices, on BITLINE and BITLINE_L, respectively, and the real mismatch causes the structure to be skewed more towards reading a '0,' then sense amplifier 120 output produces a DOUT of '0.' By equating pairs of device strengths to specific values of mismatch, these device pairs can be used to identify the presence of a mismatch, characterize the stronger side of sense amplifier 120 and memory column 304, and characterize the approximate magnitude of the effective mismatch.

Control block 308 selects the strengths of the devices in test block 302 for coupling to BITLINE and BITLINE_L. In addition, control block 308 reads DOUT and DOUT_L and compares them to the values expected if no mismatch is present. From this comparison, control block 308 determines the direction and approximate magnitude of the mismatch. In response to this determination, control block 308 writes '0's or '1's directly to SA and SA_L of sense amplifier 120 to build up the NBTI effect on the stronger side of memory column 304 and sense amplifier 120.

The direction and approximate magnitude of the mismatch may be determined by control block 308 using any suitable algorithm, technique, or ordering of a test sequence. In one realization, control block 308 introduces balanced discharge paths configuring test block 302 with the device strength pair 1× and 1× coupled to BITLINE and BITLINE_L, respectively. Then control block 308 reads DOUT and DOUT_L to determine the direction of the mismatch, i.e., which side of sense amplifier 120 and memory column 304 is stronger. For example, if DOUT is '0' then the BITLINE_L side is stronger for evaluating high. After it determines the direction of the mismatch, control block 308 selectively couples a device pair of test block 302 to BITLINE and BITLINE_L that strengthens the weaker side (e.g., 1× and 2×, respectively, where BITLINE_L is stronger).

If DOUT then evaluates as '1,' then the control block 308 determines that sense amplifier 120 and memory column 304 are slightly skewed towards BITLINE_L evaluating high, but the mismatch is less than a mismatch detectable by this mechanism. Under these circumstances, control block 308 concludes that no adjustment is needed and ceases the testing until the next time testing is triggered. If DOUT is '0,' then control block 308 determines that the skew is greater than a value indicated by the simulated mismatch introduced by test block 302. This value depends on process characteristics and on the size of the 1× devices in test block 302 relative to the transistors in the memory column 304 and sense amplifier 120.

Control block 308 may calibrate the imbalance by successively increasing the imbalance and introducing device value pairs 1× and 3×, 1× and 4X, . . . , 1× and NX until control block 308 identifies the closest approximate value of the mismatch or until it detects a significant mismatch that needs correcting. Once control block 308 detects a significant amount of mismatch and identifies the stronger side of sense amplifier 120 and memory column 304, control block 308 writes a sequence of '1's or '0's to sense amplifier 120 to build up the NBTI effect on the stronger side of sense amplifier 120 and memory column 304 to weaken it.

The above-described process of detecting, characterizing, and compensating for device mismatch may be triggered during burn-in to balance out the memory circuitry from any process or design mismatches. In addition, this process may be initiated periodically or upon detecting sensing memory errors to balance out the memory circuitry from any NBTI related skews.

While the invention has been described with reference to various embodiments, it will be understood that these embodiments are illustrative and that the scope of the invention is not limited to them. Many variations, modifications, additions, and improvements are possible. For example, while much of the description herein has focused on the illustrative context of NBTI-related $V_t$ shift in, PMOS devices of a sense amplifier, techniques of the present invention may be applied to accommodate or exploit other sources of disparate degradation or shift in characteristics of opposing or complementary devices of a differential circuit. Other disparate effects, including other disparate data-dependent effects, channel hot carrier induced effects, and accumulated, persistent or decaying levels may all be addressed and/or employed using techniques of the present invention. Similarly, although cache memory of a processor integrated circuit may profitably employ or exploit techniques of the present invention (e.g., for sense amplifier timing) other exploitations are also suitable.

More generally, realizations in accordance with the present invention have been described in the context of particular embodiments. These embodiments are meant to be illustrative and not limiting. Accordingly, plural instances may be provided for components described herein as a single instance. Boundaries between various components, operations and circuits are somewhat arbitrary, and particular operations are illustrated in the context of specific illustrative configurations. Other allocations of functionality are envisioned and may fall within the scope of claims that follow. For example, in some realizations, aspects of array test and device exposure may be performed using circuits, under control of software, or using a combination of circuit and software functionality.

While circuits and physical structures are generally presumed, it is well recognized that in modern semiconductor design and fabrication, physical structures and circuits may be embodied in computer readable descriptive form suitable for use in subsequent design, test, or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A test block for a memory circuit, wherein the test block is configured to characterize in situ a sensing offset of a sensing circuit including a cross-coupled pair of transistors.

2. The test block, as recited in claim 1, wherein the test block selectively introduces discharge paths into respective halves of a differential circuit sensed by the sensing circuit.

3. The test block, as recited in claim 2, wherein the discharge paths are selectively introduced to characterize a direction of the sensing offset.

4. The test block, as recited in claim 2, wherein the discharge paths are selectively introduced to characterize a magnitude of the sensing offset.

5. The test block, as recited in claim 1,
    wherein the sensing offset results, at least in part, from an accumulated data-dependent mismatch in characteristics of the cross-coupled transistors.

6. The test block, as recited in claim 1,
    wherein the sensing offset results, at least in part, from a disparate, negative bias temperature instability induced shift in threshold voltage ($V_t$) of at least one of the cross-coupled transistors based on disparate voltage bias histories thereof.

7. The test block, as recited in claim 1,
    wherein the sensing offset results, at least in part, from process variations in either the transistors or differential pair circuits to which the transistors are coupled.

8. An integrated circuit comprising:
    a first and a second plurality of control signals;
    a first and a second plurality of ports; and
    at least a first and a second discharge path coupled to at least one of the respective first and second plurality of ports, the effective strengths of the first and second discharge paths determined by respective ones of the first and second plurality of control signals, the first and second discharge paths configurable for characterization of a sensing offset associated with a sensing circuit.

9. The integrated circuit, as recited in claim 8, wherein the first and the second discharge paths are selectively loaded to vary the strengths of the first and the second discharge paths.

10. The integrated circuit, as recited in claim 8, wherein the first and the second discharge paths are selectively enabled, the first and the second discharge paths selected from respective ones of a first and a second plurality of discharge paths of varying strengths.

11. The integrated circuit, as recited in claim 8, wherein the first and the second plurality of control signals selectively couple at least respective ones of a first and a second capacitive load to the respective ones of the first and the second plurality of ports.

12. The integrated circuit, as recited in claim 8, wherein the first and the second plurality of control signals selectively couple at least a first and a second resistive load to the respective ones of the first and the second plurality of ports.

13. The integrated circuit, as recited in claim 8, wherein the first and the second plurality of control signals selectively enable at least one of a first plurality of transistors and at least one of a second plurality of transistors coupled to respective ones of the first and the second plurality of ports.

14. The integrated circuit, as recited in claim 8, wherein the first and the second plurality of control signals selectively enable at least one of a first plurality of inverters and at least one of a second plurality of inverters coupled to respective ones of the first and the second plurality of ports.

15. The integrated circuit, as recited in claim 8, further comprising:
a first and a second opposing bitline selectively coupled to the first and the second discharge paths.

16. The integrated circuit, as recited in claim 8, further comprising:
a control block for generating the first and second plurality of control signals based at least in part on detection of the sensing offset sensed associated with the sensing circuit, wherein the sensing circuit includes a cross-coupled pair of transistors.

17. The integrated circuit, as recited in claim 16,
wherein the control block generates additional control signals, the additional control signals at least partially compensating for the detected sensing offset by selectively exposing one of the transistors to a bias voltage selected to cause a compensating shift in a characteristic of the exposed transistor.

18. The integrated circuit, as recited in claim 16,
wherein the sensing offset results, at least in part, from an accumulated data-dependent mismatch in characteristics of the cross-coupled transistors.

19. The integrated circuit, as recited in claim 16,
wherein the sensing offset results, at least in part, from a disparate, negative bias temperature instability induced shift in threshold voltage ($V_t$) of at least one of the cross-coupled transistors based on disparate voltage bias histories thereof.

20. The integrated circuit, as recited in claim 16,
wherein the sensing offset results, at least in part, from process variations in either the transistors or differential pair circuits to which the transistors are coupled.

21. The integrated circuit, as recited in claim 17,
wherein the transistors are PMOS devices;
wherein the characteristic is threshold voltage ($V_t$); and
wherein the sensing offset involves a monotonic increase in $V_t$ based on disparate voltage bias histories of the PMOS devices.

22. The integrated circuit, as recited in claim 16, further comprising:
the sensing circuit including the cross-coupled pair of transistors.

23. The integrated circuit, as recited in claim 8, embodied in computer readable descriptive form suitable for use in design, test, or fabrication of an integrated circuit.

24. The integrated circuit, as recited in claim 8, embodied in a cache of a processor integrated circuit.

25. A method of detecting in situ a sensing offset in a sensing circuit including a pair of cross-coupled transistors comprising:
selectively configuring a pair of discharge paths in a first configuration;
introducing the pair of discharge paths into respective halves of a differential circuit; and
sensing the differential circuit.

26. The method of claim 25, further comprising:
characterizing a direction of the sensing offset based at least in part on a value sensed in presence of the discharge paths in the first configuration.

27. The method, as recited in claim 25,
wherein the sensing offset results, at least in part, from an accumulated data-dependent mismatch in characteristics of the cross-coupled transistors.

28. The method, as recited in claim 25,
wherein the sensing offset results, at least in part, from a disparate, negative bias temperature instability induced shift in threshold voltage ($V_t$) of at least one of the cross-coupled transistors based on disparate voltage bias histories thereof.

29. The method, as recited in claim 25,
wherein the sensing offset results, at least in part, from process variations in either the transistors or differential pair circuits to which the transistors are coupled.

30. The method, as recited in claim 27,
wherein the transistors are PMOS devices;
wherein the characteristic is threshold voltage ($V_t$); and
wherein the sensing offset involves a monotonic increase in $V_t$ based on disparate voltage bias histories of the PMOS devices.

31. The method of claim 25, wherein the first configuration substantially balances the discharge paths.

32. The method of claim 25, further comprising:
selectively configuring the pair of discharge paths in a second configuration;
characterizing a magnitude of the sensing offset based at least in part on a value sensed in presence of the discharge paths in the second configuration.

33. The method of claim 25, wherein the second configuration imbalances the discharge paths.

34. The method of claim 33, further comprising:
successively changing the imbalance of the discharge paths by selectively reconfiguring the pair of discharge paths; and
characterizing a magnitude of the sensing offset based at least in part on a value sensed in presence of the successively changed imbalance of the discharge paths.

35. The method of claim 25, wherein the third configuration introduces to the discharge paths an imbalance incrementally varied from prior configurations.

36. The method of claim 25, wherein the characterization occurs during burn-in.

37. The method of claim 25, wherein the characterization occurs subsequent to burn-in.

38. The method of claim 25, wherein the characterization occurs periodically.

39. The method of claim 25, wherein the characterization occurs in response to sensing memory errors.

40. An apparatus comprising:
means for detecting in situ a sensing offset in a sensing circuit that includes a cross-coupled pair of transistors; and
means for characterizing a magnitude of the sensing offset.

41. The apparatus of claim 40, further comprising
means for characterizing a direction of the sensing offset.

* * * * *